US008501585B2

(12) United States Patent
Yamazaki et al.

(10) Patent No.: US 8,501,585 B2
(45) Date of Patent: Aug. 6, 2013

(54) MANUFACTURING METHOD OF SEMICONDUCTOR DEVICE

(75) Inventors: Shunpei Yamazaki, Setagaya (JP); Takeshi Shichi, Atsugi (JP); Naoki Suzuki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 18 days.

(21) Appl. No.: 12/247,439

(22) Filed: Oct. 8, 2008

(65) Prior Publication Data
US 2009/0098690 A1 Apr. 16, 2009

(30) Foreign Application Priority Data
Oct. 10, 2007 (JP) .................. 2007-264424

(51) Int. Cl.
*H01L 21/30* (2006.01)
*H01L 21/46* (2006.01)

(52) U.S. Cl.
USPC ......................................... 438/458; 438/455

(58) Field of Classification Search
USPC .................. 438/455, 458, 459, 201; 257/374
See application file for complete search history.

(56) References Cited

U.S. PATENT DOCUMENTS

| | | | |
|---|---|---|---|
| 5,064,775 A | 11/1991 | Chang | |
| 5,104,818 A | 4/1992 | Silver | |
| 5,374,564 A | 12/1994 | Bruel | |
| 5,904,509 A | 5/1999 | Zhang et al. | |
| 5,910,666 A | 6/1999 | Wen | |
| 6,127,702 A | 10/2000 | Yamazaki et al. | |
| 6,174,759 B1 * | 1/2001 | Verhaar et al. | 438/201 |
| 6,191,007 B1 | 2/2001 | Matsui et al. | |
| 6,271,101 B1 | 8/2001 | Fukunaga | |
| 6,335,231 B1 | 1/2002 | Yamazaki et al. | |
| 6,362,078 B1 * | 3/2002 | Doyle et al. | 438/459 |
| 6,380,046 B1 | 4/2002 | Yamazaki | |
| 6,388,652 B1 | 5/2002 | Yamazaki et al. | |
| 6,455,360 B1 | 9/2002 | Miyasaka | |
| 6,524,929 B1 * | 2/2003 | Xiang et al. | 438/424 |
| 6,534,380 B1 | 3/2003 | Yamauchi et al. | |
| 6,602,761 B2 | 8/2003 | Fukunaga | |
| 6,638,813 B1 * | 10/2003 | Tzeng et al. | 438/244 |

(Continued)

FOREIGN PATENT DOCUMENTS
JP 2003-257992 9/2003

OTHER PUBLICATIONS
Wolf, S. et al., Silicon Processing for the VLSI Era, 1986, vol. 1: Process Technology, pp. 323-325, Lattice Press.

*Primary Examiner* — Kimberly Rizallah
*Assistant Examiner* — Errol Fernandes
(74) *Attorney, Agent, or Firm* — Eric J. Robinson; Robinson Intellectual Property Law Office, P.C.

(57) ABSTRACT

To realize high performance and low power consumption of a semiconductor device by controlling electric characteristics of a transistor in accordance with a required function. Further, to manufacture such a semiconductor device with high yield and high productivity without complicating a manufacturing process. An impurity element imparting one conductivity type is added to a first semiconductor wafer in order to control the threshold voltage of a transistor included in the semiconductor device, before separating a single crystal semiconductor layer used as a channel formation region of the transistor from the first semiconductor wafer and transferring the single crystal semiconductor layer to a second semiconductor wafer.

20 Claims, 8 Drawing Sheets

U.S. PATENT DOCUMENTS

| | | | |
|---|---|---|---|
| 6,686,623 | B2 | 2/2004 | Yamazaki |
| 6,778,164 | B2 | 8/2004 | Yamazaki et al. |
| 6,803,264 | B2 | 10/2004 | Yamazaki et al. |
| 6,875,633 | B2 | 4/2005 | Fukunaga |
| 6,908,797 | B2 | 6/2005 | Takano |
| 7,045,442 | B2 | 5/2006 | Maruyama et al. |
| 7,176,525 | B2 | 2/2007 | Fukunaga |
| 7,199,024 | B2 | 4/2007 | Yamazaki |
| 7,256,776 | B2 | 8/2007 | Yamazaki et al. |
| 7,829,434 | B2 | 11/2010 | Yamazaki et al. |
| 2003/0162346 | A1 | 8/2003 | Srinivasan |
| 2003/0207545 | A1 | 11/2003 | Yasukawa |
| 2004/0097055 | A1 | 5/2004 | Henley et al. |
| 2004/0104424 | A1 | 6/2004 | Yamazaki |
| 2005/0009252 | A1 | 1/2005 | Yamazaki et al. |
| 2005/0260800 | A1 | 11/2005 | Takano |
| 2006/0084249 | A1 | 4/2006 | Yamada |
| 2007/0087488 | A1 | 4/2007 | Moriwaka |
| 2007/0108510 | A1 | 5/2007 | Fukunaga |
| 2007/0132035 | A1 * | 6/2007 | Ko et al. ............. 257/374 |
| 2007/0141802 | A1 | 6/2007 | Gadkaree |
| 2007/0173000 | A1 | 7/2007 | Yamazaki |
| 2007/0184632 | A1 | 8/2007 | Yamazaki et al. |
| 2007/0281399 | A1 | 12/2007 | Cites et al. |
| 2007/0291022 | A1 | 12/2007 | Yamazaki et al. |
| 2008/0160661 | A1 | 7/2008 | Henley |
| 2008/0179547 | A1 | 7/2008 | Henley |
| 2008/0248629 | A1 | 10/2008 | Yamazaki |

* cited by examiner

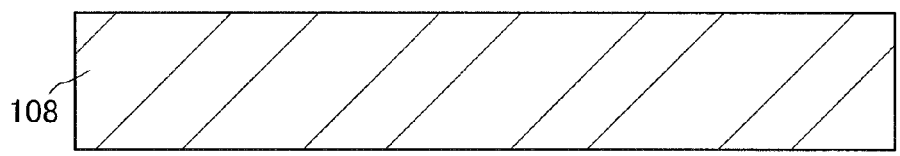
FIG. 5A
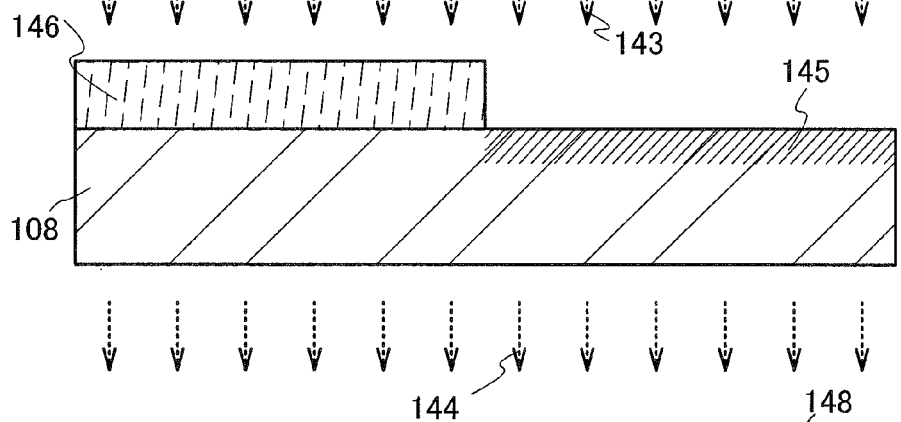
FIG. 5B
FIG. 5C
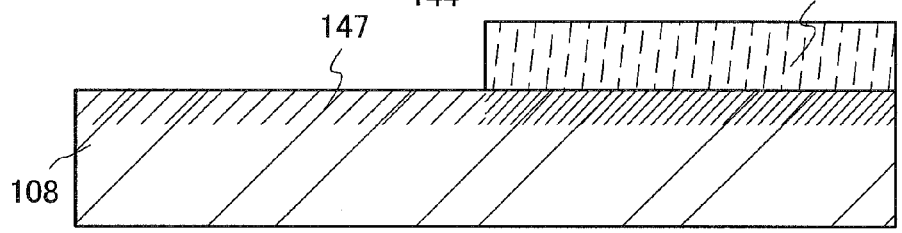
FIG. 5D
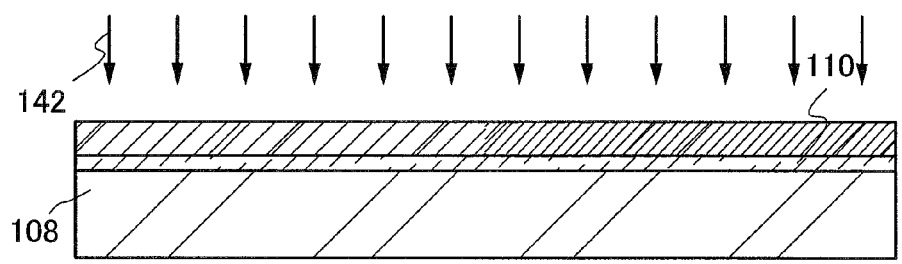
FIG. 5E
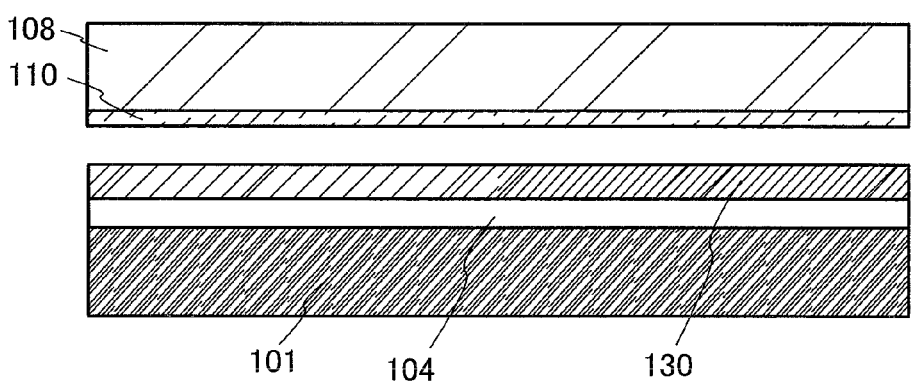

MANUFACTURING METHOD OF SEMICONDUCTOR DEVICE

BACKGROUND OF THE INVENTION

1. Field of the Invention

The present invention relates to a manufacturing method of a semiconductor device having a so-called silicon-on-insulator (SOI) structure in which a single crystal semiconductor layer is provided on an insulating layer.

2. Description of the Related Art

An integrated circuit using a technique called silicon on insulator (hereinafter also referred to as "SOI") in which a thin single crystal semiconductor layer is provided on an insulating layer, instead of using a silicon wafer which is manufactured by thinly slicing an ingot of a single crystal semiconductor, has been developed. The SOI structure is a structure which is made by forming a silicon oxide layer in a single crystal semiconductor substrate so that a single crystal semiconductor layer exists over the silicon oxide layer. The substrate having this SOI structure is also called an SOI substrate. An integrated circuit using an SOI substrate has attracted attention as an integrated circuit which reduces parasitic capacitance between the transistors and the substrate and improves performance of the semiconductor integrated circuit.

A transistor is a switching element that is turned on when a certain amount of voltage (referred to as a threshold value or a threshold voltage) is applied to a gate electrode and is turned off when a voltage of less than the certain amount is applied. Therefore, it is very important to control a threshold voltage precisely in terms of accurate operation of a circuit.

However, the threshold voltage of a transistor is, in some cases, moved (shifted) toward the minus side or the plus side by an indefinite factor such as an effect of a movable ion due to contamination and an influence of difference in work function and an interface charge in the periphery of a gate of the transistor.

As a technique proposed as a means for solving such a phenomenon, a channel doping method is given. The channel doping method is a technique in which an impurity element imparting one conductivity type (typically, P, As, B, or the like) is added to at least a channel formation region of a transistor and a threshold voltage is controlled by being shifted intentionally (e.g., see Patent Document 1: Japanese Published Patent Application No. 2003-257992).

SUMMARY OF THE INVENTION

However, transistors manufactured for a semiconductor device include an n-channel transistor and a p-channel transistor, which have different conductivity types, and electric characteristics or functions to be needed are different from one another depending on an intended use. Therefore, it is necessary to control electric characteristics of transistors in accordance with respective functions required in the transistors.

An object of the present invention is to control electric characteristics of transistors in accordance with required functions and realize higher performance and lower power consumption of a semiconductor device. Another object of the present invention is to manufacture such a semiconductor device with high yield and high productivity without complicating a manufacturing process.

In manufacturing a semiconductor device having an SOI structure, an impurity element is added to a first semiconductor wafer in order to control the threshold voltage of a transistor included in the semiconductor device, before separating a semiconductor layer of the transistor from the first semiconductor wafer and transferring the semiconductor layer to a second semiconductor wafer. The transistor in the present invention means a field-effect transistor. Note that in this specification, addition of an impurity element having one conductivity type for controlling the threshold voltage of a transistor is also referred to as a channel doping step, and an impurity region formed in a channel formation region by the channel doping step is also referred to as a channel doping region.

In order to separate a single crystal semiconductor layer from the first semiconductor wafer, the first semiconductor wafer is irradiated with ions to form an embrittlement layer at a certain depth from the surface of the first semiconductor wafer. The region irradiated with the ions, which is from the surface of the first semiconductor wafer to the embrittlement layer, is separated from the first semiconductor wafer as the single crystal semiconductor layer; accordingly, the channel doping step is performed on at least such a region. It is acceptable as long as the channel doping step is performed before separation of the single crystal semiconductor layer from the first semiconductor wafer. Therefore, the channel doping step may be performed before or after the formation of the embrittlement layer.

The step of adding the impurity element for controlling the threshold voltage (channel doping step) may be performed using an ion doping method or an ion implantation method.

By the heat treatment included in the process in which the single crystal semiconductor layer is separated from the first semiconductor wafer and transferred to the second semiconductor wafer by bonding, the impurity region to which the impurity element having one conductivity type is added can be activated as well. Therefore, it is not necessary to increase a heating step for activation of the impurity element which is added in the channel doping step.

The single crystal semiconductor layer is separated from the first semiconductor wafer and transferred to the second semiconductor wafer so that the surface of the single crystal semiconductor layer through which the impurity element is added in the channel doping step faces the second semiconductor wafer side. Accordingly, the surface (the surface opposite to the surface through which the impurity element is added) of the single crystal semiconductor layer transferred to be placed over the second semiconductor wafer can be prevented from suffering damage (such as surface roughness and entry of contaminants) from the channel doping step.

In this specification, a process of separating a single crystal semiconductor layer from a first semiconductor wafer and providing the single crystal semiconductor layer for a second semiconductor wafer by bonding is referred to as transferring (transposing) the single crystal semiconductor layer from the first semiconductor wafer to the second semiconductor wafer. Accordingly, in the present invention, the transistor includes a single crystal semiconductor layer transferred to the second semiconductor wafer from the first semiconductor wafer. Note that the transferred single crystal semiconductor layer is a single crystal semiconductor layer including the impurity region which has been formed by the channel doping step in the first semiconductor wafer before transferring to the second semiconductor wafer.

In the channel doping step, an impurity element imparting n-type conductivity (typically, phosphorus (P), arsenic (As), or the like) or an impurity element imparting p-type conductivity (typically, boron (B), aluminum (Al), gallium (Ga), or the like) can be used as the impurity element which is added and imparts one conductivity type. One kind of impurity element or plural kinds of impurity elements having different conductivity types may be used. The adding step may be performed once or plural times. Further, the impurity element may be selectively added to the first semiconductor wafer using a mask to form impurity regions having different impurity concentrations. Further, impurity elements imparting different conductivity types may be selectively added in accordance with the conductivity types of transistors to be manufactured, to form impurity regions having different conductivity types in the first semiconductor wafer.

For example, in the case where an influence of an interface charge is taken into consideration, the threshold voltage of an n-channel transistor, whose carriers are electrons, tends to be shifted toward the minus side, and the threshold voltage of a p-channel transistor, whose carriers are holes, tends to be shifted toward the plus side. In such a case, an impurity element imparting one conductivity type, which is added to a channel formation region for controlling the threshold voltage of the transistor, preferably has a conductivity type which is opposite to that of a source region or a drain region of the transistor. For example, in the n-channel transistor in which the threshold voltage is shifted toward the minus side, an impurity element imparting p-type conductivity can be used as the impurity element contained in the impurity region provided in the channel formation region. Further, in the p-channel transistor in which the threshold voltage is shifted toward the plus side, an impurity element imparting n-type conductivity can be used as the impurity element contained in the impurity region provided in the channel formation region.

If the step of adding an impurity element for controlling the threshold voltage is performed on the first semiconductor wafer, the concentration profile in the impurity region can be selected from a wide range and can be set freely. For example, in the case where an impurity element is added so that the concentration peak is near the surface of a first semiconductor wafer to which the impurity element is added and a single crystal semiconductor layer is transferred from the first semiconductor wafer to a second semiconductor wafer provided with an insulating film serving as a base film, the single crystal semiconductor layer containing the impurity element added at a high concentration near the interface with the insulating film can be formed.

The channel doping region (region to which the impurity element imparting one conductivity type is added) in the first semiconductor wafer preferably at least includes a channel formation region of a transistor to be formed through transfer of the single crystal semiconductor layer from the first semiconductor wafer to the second semiconductor wafer. Therefore, the channel doping region includes a region to which the impurity element is added, which is from the surface of the first semiconductor wafer to the embrittlement layer. The impurity element may be added to an entire region or part of the region between the surface of the first semiconductor wafer and the embrittlement layer. Further, part of the channel doping region may be formed down to a region below the embrittlement layer in the first semiconductor wafer.

One aspect of a manufacturing method of a semiconductor device according to the present invention is to form an impurity region by adding an impurity element imparting one conductivity type to a first semiconductor wafer from a surface of the first semiconductor wafer. Irradiation with ions is performed on the surface of the first semiconductor wafer to which the impurity element is added, so that an embrittlement layer is formed below the impurity region with respect to the surface of the first semiconductor wafer. An insulating layer is formed over either the surface of the first semiconductor wafer or a second semiconductor wafer. With the first semiconductor wafer and the second semiconductor wafer bonded with the insulating layer interposed therebetween, heat treatment for generating a crack in the embrittlement layer and separating the first semiconductor wafer at the embrittlement layer is performed; accordingly, a single crystal semiconductor layer including the impurity region, which is separated from the first semiconductor wafer, is formed over the second semiconductor wafer. A field-effect transistor is formed using the impurity region of the single crystal semiconductor layer as a channel formation region.

Another aspect of the manufacturing method of a semiconductor device according to the present invention is to form an embrittlement layer at a certain depth from a surface of a first semiconductor wafer by irradiating the one surface of the first semiconductor wafer with ions. An impurity element imparting one conductivity type is added from the surface of the first semiconductor wafer, so that an impurity region is formed between the surface of the first semiconductor wafer and the embrittlement layer. An insulating layer is formed over either the surface of the first semiconductor wafer or a second semiconductor wafer. With the first semiconductor wafer and the second semiconductor wafer bonded with the insulating layer interposed therebetween, heat treatment for generating a crack in the embrittlement layer and separating the first semiconductor wafer at the embrittlement layer is performed; accordingly, a single crystal semiconductor layer including the impurity region, which is separated from the first semiconductor wafer, is formed over the second semiconductor wafer. A field-effect transistor is formed using the impurity region of the single crystal semiconductor layer as a channel formation region.

The single crystal semiconductor layer transferred from the first semiconductor wafer to the second semiconductor wafer may be subjected to etching treatment, polishing treatment, or the like as long as a region used as a channel formation region in the transistor to be manufactured becomes a channel doping region.

In addition, a protective layer may be formed between the first semiconductor wafer and the insulating layer having a bonding surface. The protective layer can be formed of a single layer or a stacked structure of a plurality of layers selected from a silicon nitride layer, a silicon oxide layer, a silicon nitride oxide layer, or a silicon oxynitride layer. Any of these layers can be formed over the first semiconductor wafer before the embrittlement layer and the impurity region are formed in the first semiconductor wafer. Alternatively, any of these layers may be formed over the first semiconductor wafer after the embrittlement layer and the impurity region are formed in the first semiconductor wafer.

In this manner, electric characteristics of a transistor is controlled in accordance with the function required for a second semiconductor wafer by a channel doping step of a first semiconductor wafer; accordingly, a semiconductor device with high performance and low power consumption can be achieved. Further, such a semiconductor device can be manufactured with high yield and high productivity without complicating a manufacturing process.

BRIEF DESCRIPTION OF THE DRAWINGS

In the accompanying drawing:

FIGS. 5A to 5E illustrate a manufacturing method of a semiconductor device according to the present invention;

DETAILED DESCRIPTION OF THE INVENTION

Figure 1A:
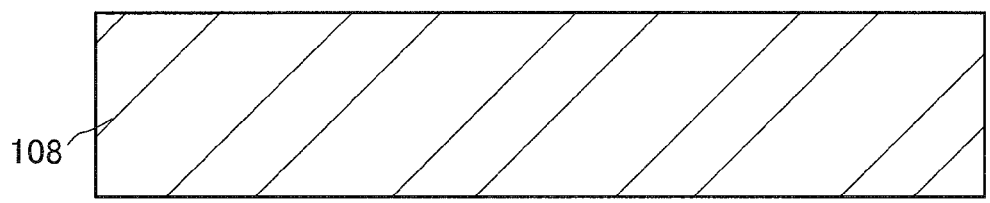
FIGS. 1A to 1C illustrate a manufacturing method of a semiconductor device according to the present invention.

Embodiment modes of the present invention will be described with reference to the drawings. The present invention is not limited to the following description, and it is easily understood by those skilled in the art that modes and details herein disclosed can be modified in various ways without departing from the spirit and the scope of the present invention. Therefore, the present invention is not to be construed with limitation to what is described in the embodiment modes. Note that the same portions or portions having a similar function are denoted by the same reference numeral through different drawings in a structure of the present invention described hereinafter, and repetitive description thereof is omitted.

Embodiment Mode 1

A manufacturing method of a semiconductor device of the present invention will be described with reference to FIGS. 1A to 1C, FIGS. 2A to 2C, FIGS. 3A to 3C, and FIGS. 4A to 4D.

In this embodiment mode, addition of an impurity element to a first semiconductor wafer for controlling the threshold voltage of a transistor included in a semiconductor device is performed before separating a single crystal semiconductor layer of a transistor from the first semiconductor wafer and transferring the single crystal semiconductor layer to a second semiconductor wafer. It is preferable that a silicon wafer be used as the first semiconductor wafer and a single crystal silicon layer be separated from the first semiconductor wafer and bonded to an upper surface of the second semiconductor wafer.

First, a method for providing the single crystal semiconductor layer from the first semiconductor wafer (also referred to as a semiconductor substrate) over the second semiconductor wafer will be described with reference to FIGS. 1A to 1C, FIGS. 2A to 2C, FIGS. 3A to 3C, and FIGS. 4A to 4D.

FIG. 1A illustrates a cleaned first semiconductor wafer 108. As the first semiconductor wafer 108, a semiconductor wafer such as a silicon wafer or a germanium wafer, or a compound semiconductor wafer such as a gallium arsenide wafer or an indium phosphide wafer is used. It is preferable that a single crystal semiconductor wafer be used as the first semiconductor wafer 108, but a polycrystalline semiconductor wafer may be used as well. Alternatively, a semiconductor wafer formed of silicon having lattice distortion, silicon germanium in which germanium is added to silicon, or the like may be used. Silicon having lattice distortion can be formed by formation of silicon on silicon germanium or silicon nitride which has a larger lattice constant than silicon. A single crystal semiconductor layer obtained over a second semiconductor wafer can be determined by selecting a semiconductor wafer to serve as a base.

The crystal plane orientation of the first semiconductor wafer 108 may be selected in accordance with a semiconductor element (in this embodiment mode, a field-effect transistor) to be manufactured. For example, a semiconductor wafer having {100} plane, {110} plane, or the like as a crystal plane orientation can be used.

Figure 1B:
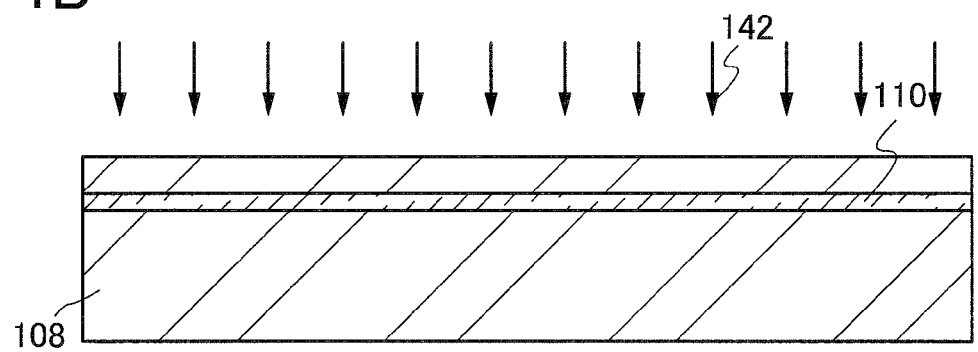
Figure 1C:
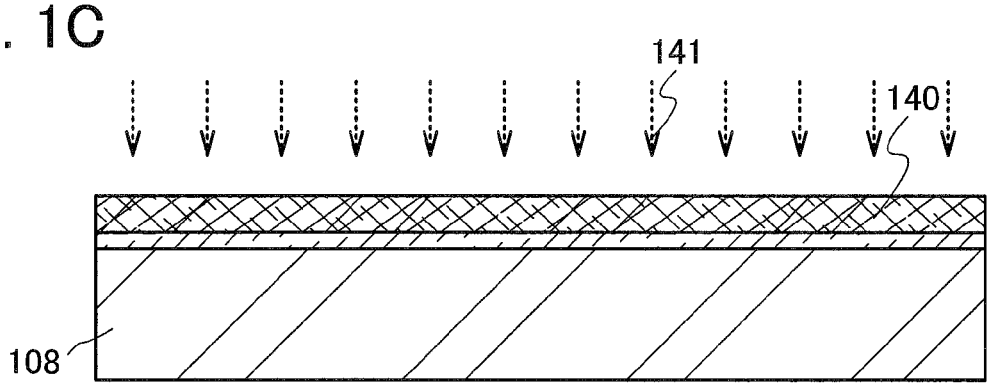

A region at a predetermined depth is irradiated with ions 142 accelerated by electric field through a surface of the first semiconductor wafer 108; accordingly, an embrittlement layer 110 is formed (see FIG. 1B). The irradiation with the ions 142 is performed in consideration of the thickness of the single crystal semiconductor layer to be transferred to the second semiconductor wafer. An accelerating voltage in irradiating the first semiconductor wafer 108 with the ions 142 is set in consideration of such a thickness.

In this embodiment mode, an ion irradiation separation method in which a region at a predetermined depth of a first semiconductor wafer is irradiated with hydrogen, helium, or fluorine ions, heat treatment is then conducted, and a single crystal semiconductor layer, which is an outer layer, is separated can be used. Alternatively, a method in which single crystal silicon is epitaxially grown on porous silicon and the porous silicon layer is separated by cleavage by water jetting may also be employed.

For example, a single crystal silicon substrate is used as the first semiconductor wafer 108, and the surface thereof is processed with a dilute hydrofluoric acid. Accordingly, a natural oxide film is removed and a contaminant such as dust or the like attached to the surface is also removed, whereby the surface of the first semiconductor wafer 108 is cleaned.

The embrittlement layer 110 may be formed by irradiation with ions by an ion doping method (also referred to as an ID method) or an ion implantation method (also referred to as an II method). The embrittlement layer 110 is formed by irradiation with ions of hydrogen, helium, or a halogen typified by fluorine. In the case of irradiation with fluorine ions as a halogen element, $BF_3$ may be used as a source gas. Note that an ion implantation method refers to a method in which an ionized gas is mass-separated to irradiate a semiconductor.

For example, by an ion implantation method, an ionized hydrogen gas is mass-separated and only $H^+$ ions are selectively accelerated for irradiation. At this time, the $H^+$ ions are added to a deeper region of a first semiconductor wafer at the same energy compared with the case of irradiation with ions having other masses, and a broad concentration profile of $H^+$ ions is shown.

In an ion doping method, a plurality of kinds of ion species are generated in plasma from an ionized gas without mass separation, and accelerated to be introduced into a first semiconductor wafer by doping. For example, in hydrogen including $H^+$ ions, $H_2^+$ ions, and $H_3^+$ ions, the percentage of $H_3^+$ ions introduced is typically equal to or greater than 50%, and generally the percentage of $H_3^+$ ions introduced is, for example, 80% and the percentage of the other ions ($H^+$ ions, $H_2^+$ ions) is 20%. Here, addition of only an ion species of $H_3^+$ ions is also referred to as ion doping. That is, since $H_3^+$ ions have a large mass, a large amount of $H_3^+$ ions can be shallowly added to a first semiconductor wafer when the same accelerating energy is applied to $H^+$ ions, $H_2^+$ ions, and $H_3^+$ ions. Therefore, a sharp concentration profile of $H_3^+$ ions is shown.

When the single crystal silicon substrate is irradiated with halogen ions such as fluorine ions by an ion irradiation method, introduced fluorine knocks out (expels) silicon atoms in the silicon crystal lattice, so that blank portions are created effectively and microvoids are formed in the embrittlement layer. In this case, heat treatment is performed at a relatively low temperature, so that a change occurs in the volume of the microvoids formed in the embrittlement layer, and a thin single crystal semiconductor layer can be formed by cleavage along the embrittlement layer. After irradiation with fluorine ions, irradiation with hydrogen ions may be performed so that hydrogen is contained in the voids. Since the embrittlement layer which is formed to separate the thin single crystal semiconductor layer from the first semiconductor wafer cleaves using a change in the volume of the microvoids formed in the embrittlement layer, it is preferable to make effective use of fluorine ion operation or hydrogen ion operation.

In addition, irradiation may be performed using a single kind of ions or plural kinds of ions of the same atom which have different masses. For example, in the case of irradiation with hydrogen ions, the hydrogen ions preferably include $H^+$ ions, $H_2^+$ ions, and $H_3^+$ ions with a high proportion of $H_3^+$ ions. In the case of hydrogen ion irradiation, when the hydrogen ions include $H^+$ ions, $H_2^+$ ions, and $H_3^+$ ions with a high proportion of $H_3^+$ ions, efficiency in addition can be increased and irradiation time can be shortened. By this structure, separation can be performed easily.

Next, a channel doping step is performed on the first semiconductor wafer 108 in order to control the threshold voltage of a transistor formed using a single crystal semiconductor layer which is to be separated. The channel doping step may be performed by an ion doping method or an ion implantation method. The region separated from the first semiconductor wafer 108 used as the single crystal semiconductor layer is a region irradiated with the ions, which is from the surface of the first semiconductor wafer 108 to the embrittlement layer 110; therefore, the channel doping step is performed on at least the region. An impurity element 141 imparting one conductivity type is added to the first semiconductor wafer 108, to form an impurity region (channel doping region) 140 (see FIG. 1C).

Figure 2A:
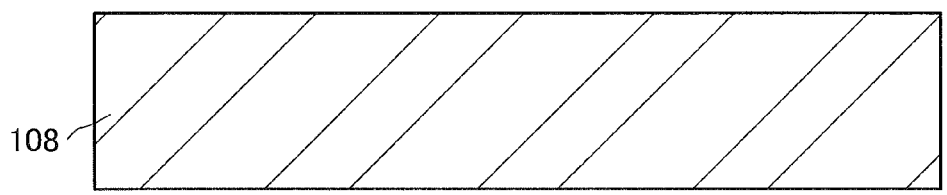
FIGS. 2A to 2C illustrate a manufacturing method of a semiconductor device according to the present invention.
Figure 2B:
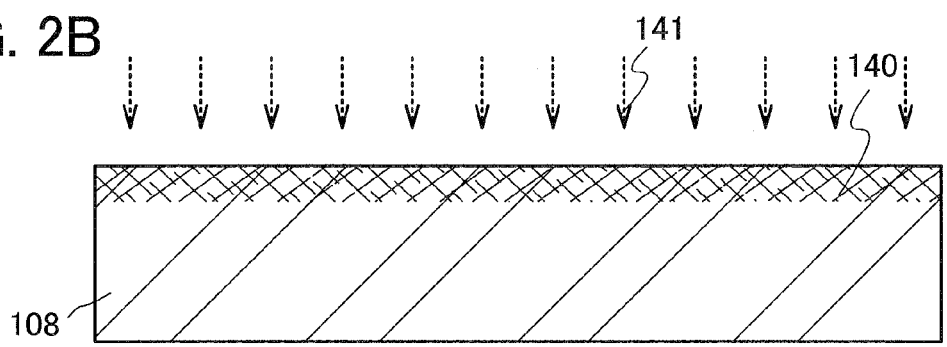
Figure 2C:
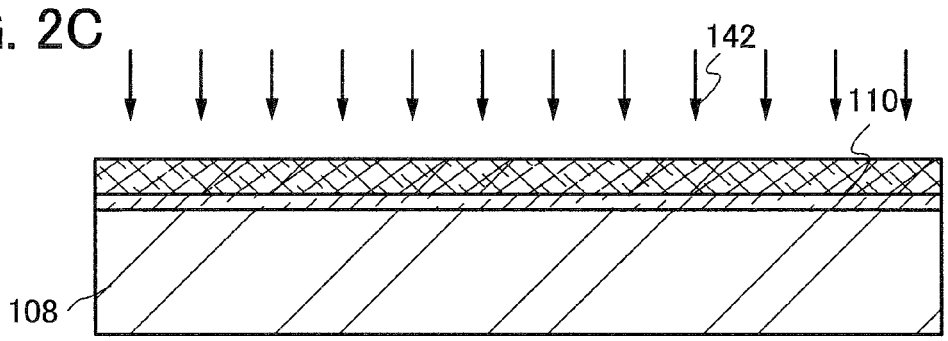

It is acceptable as long as the channel doping step is performed before separation of the single crystal semiconductor layer from the first semiconductor wafer. Therefore, the channel doping step may be performed before or after the formation of the embrittlement layer. FIGS. 2A to 2C illustrate an example in which a channel doping step is performed before the formation of the embrittlement layer 110.

FIG. 2A illustrates the cleaned first semiconductor wafer 108. The impurity element 141 imparting one conductivity type is added to the first semiconductor wafer 108, to form the impurity region (channel doping region) 140 near the surface of the first semiconductor wafer 108 (see FIG. 2B). Then, the first semiconductor wafer 108 in which the impurity region 140 has been formed is irradiated with the ions 142, to form the embrittlement layer 110 (see FIG. 2C).

In the channel doping step, an impurity element imparting n-type conductivity (typically, phosphorus (P), arsenic (As), or the like) or an impurity element imparting p-type conductivity (typically, boron (B), aluminum (Al), gallium (Ga), or the like) can be used as the impurity element which is added and imparts one conductivity type. One kind of impurity element or plural kinds of impurity elements having different conductivity types may be used. The adding step may be performed once or plural times. Further, the impurity element may be selectively added to the first semiconductor wafer using a mask to form impurity regions having different impurity concentrations. Further, impurity elements imparting different conductivity types may be selectively added in accordance with the conductivity types of transistors to be manufactured, to form impurity regions having different conductivity types in the first semiconductor wafer.

For example, in the case where an influence of an interface charge is taken into consideration, the threshold voltage of an n-channel transistor, whose carriers are electrons, tends to be shifted toward the minus side, and the threshold voltage of a p-channel transistor, whose carriers are holes, tends to be shifted toward the plus side. In such a case, an impurity element imparting one conductivity type, which is added to a channel formation region for controlling the threshold voltage of the transistor, preferably has a conductivity type which is opposite to that of a source region or a drain region of the transistor. For example, in the n-channel transistor in which the threshold voltage is shifted toward the minus side, an impurity element imparting p-type conductivity can be used as the impurity element contained in the impurity region provided in the channel formation region. Further, in the p-channel transistor in which the threshold voltage is shifted toward the plus side, an impurity element imparting n-type conductivity can be used as the impurity element contained in the impurity region provided in the channel formation region.

If the step of adding an impurity element for controlling the threshold voltage is performed on the first semiconductor wafer, the concentration profile in the impurity region can be selected from a wide range and can be set freely. For example, in the case where an impurity element is added so that the concentration peak is near the surface of a first semiconductor wafer to which the impurity element is added and a single crystal semiconductor layer is transferred from the first semiconductor wafer to a second semiconductor wafer provided with an insulating film serving as a base film, the single crystal semiconductor layer containing the impurity element added at a high concentration near the interface with the insulating film can be formed.

The channel doping region (region to which the impurity element imparting one conductivity type is added) in the first semiconductor wafer preferably at least includes a channel formation region of a transistor to be formed through transfer of the single crystal semiconductor layer from the first semiconductor wafer to the second semiconductor wafer. Therefore, the channel doping region includes a region to which the impurity element is added, which is from the surface of the first semiconductor wafer to the embrittlement layer. The impurity element may be added to an entire region or part of the region between the surface of the first semiconductor wafer and the embrittlement layer. Further, part of the channel doping region may be formed down to a region below the embrittlement layer in the first semiconductor wafer.

Note that, in this specification, a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Further, a protective layer may be formed between the first semiconductor wafer and the insulating layer which is bonded to the above-described single crystal semiconductor layer. The protective layer can be formed of a single layer or a stacked structure of a plurality of layers selected from a silicon nitride layer, a silicon oxide layer, a silicon nitride oxide layer, or a silicon oxynitride layer. These layers can be formed over the first semiconductor wafer before the embrittlement layer and an impurity region by the channel doping step are formed in the first semiconductor wafer. Alternatively, these layers may be formed over the first semiconductor wafer after the embrittlement layer and an impurity region by the channel doping step are formed in the first semiconductor wafer.

It is necessary to perform irradiation with ions under high dose conditions in the formation of the embrittlement layer, but the surface of the first semiconductor wafer 108 becomes rough in some cases. Therefore, a protective layer against ion irradiation having a thickness of 50 nm to 200 nm, such as a silicon nitride film, a silicon nitride oxide film, or a silicon oxide film may be provided on the surface which is irradiated with ions.

For example, a stacked layer of a silicon oxynitride film (with a thickness of 5 nm to 300 nm, preferably, 30 nm to 150 nm (e.g., 50 nm)) and a silicon nitride oxide film (with a thickness of 5 nm to 150 nm, preferably, 10 nm to 100 nm (e.g., 50 nm)) is formed by a plasma CVD method as a protective layer over the first semiconductor wafer 108. As an example, a silicon oxynitride film is formed at a thickness of 50 nm over the first semiconductor wafer 108, and a silicon nitride oxide film is stacked at a thickness of 50 nm over the silicon oxynitride film. A silicon oxynitride film may be a silicon oxide film formed by a chemical vapor deposition method using an organosilane gas.

Further, the first semiconductor wafer 108 may be degreased and cleaned to remove an oxide film on the surface, and thermal oxidation may be performed. As thermal oxidation, general dry oxidation may be performed; however, oxidation in an oxidizing atmosphere in which a halogen is added is preferably performed. For example, heat treatment is carried out in an atmosphere containing HCL at a ratio of 0.5 to 10 vol. % (preferably, 3 vol. %) with respect to oxygen at a temperature of 700° C. or higher. Preferably, thermal oxidation is performed at a temperature of 950° C. to 1100° C. Processing time may be 0.1 to 6 hours, and preferably 0.5 to 3.5 hours. The thickness of the oxide film thus formed is made to be 10 nm to 1000 nm (preferably, 50 nm to 200 nm), and for example, 100 nm.

As a material including a halogen, one or more of HF, $NF_3$, HBr, $Cl_2$, $ClF_3$, $BCl_3$, $F_2$, $Br_2$, and the like can be used as well as HCl.

Heat treatment is performed in such a temperature range, whereby a gettering effect due to a halogen element can be obtained. Gettering is particularly effective in removing a metal impurity. That is, by operation of chlorine, an impurity such as a metal is separated and removed into the air as volatile chloride. The gettering is effective on the surface of the first semiconductor wafer 108 subjected to chemical mechanical polishing (CMP). In addition, hydrogen has action of compensating a defect at the interface between the first semiconductor wafer 108 and the oxide film to be formed so as to lower a localized level density at the interface, whereby the interface between the first semiconductor wafer 108 and the oxide film is inactivated to stabilize electric characteristics.

A halogen can be contained in the oxide film formed by this heat treatment. A halogen element can be contained at a concentration of $1\times10^{17}/cm^3$ to $5\times10^{20}/cm^3$, whereby the oxide film can function as a protective layer which captures impurities such as a metal or the like and prevents contamination of the first semiconductor wafer 108.

When the embrittlement layer 110 is formed, the accelerating voltage and the number of all ions can be adjusted in accordance with the thickness of a film deposited over the first semiconductor wafer, the thickness of the targeted single crystal semiconductor layer which is separated from the first semiconductor wafer and transferred to a second semiconductor wafer, and the ion species which is used for irradiation. The ion species also changes depending on the plasma generation method, pressure, supply of a source gas, and accelerating voltage.

As another example of forming the embrittlement layer, a silicon oxynitride film (thickness: 50 nm), a silicon nitride oxide film (thickness: 50 nm), and a silicon oxide film (thickness: 50 nm) are stacked as a protective layer over the first semiconductor wafer, and irradiation with hydrogen is performed at an accelerating voltage of 40 kV at a dose of $2\times10^{16}$ ions/cm$^2$, so that the embrittlement layer is formed in the first semiconductor wafer. Then, a silicon oxide film (thickness: 50 nm) is formed as an insulating layer over the silicon oxide film which is a top layer of the protective layer. As another example of forming the embrittlement layer, a silicon oxide film (thickness: 100 nm) and a silicon nitride oxide film (thickness: 50 nm) are stacked as a protective layer over the first semiconductor wafer, and irradiation with hydrogen is performed at an accelerating voltage of 40 kV at a dose of $2\times10^{16}$ ions/cm$^2$, so that the embrittlement layer is formed in the first semiconductor wafer. Then, a silicon oxide film (thickness: 50 nm) is formed as an insulating layer over the silicon nitride oxide film which is a top layer of the protective layer. Note that the silicon oxynitride film or the silicon nitride oxide film may be formed by a plasma CVD method, and the silicon oxide film may be formed by a CVD method using an organosilane gas.

The silicon nitride oxide film has an effect of preventing a metal impurity from diffusing into the first semiconductor wafer side. Note that, instead of the silicon nitride oxide film, a silicon nitride film may be formed. A stress alleviation layer such as a silicon oxynitride film or silicon oxide film is preferably provided between the first semiconductor wafer and the silicon nitride oxide film. When a stacked layer structure of the silicon nitride oxide film and the silicon oxynitride film is provided, an impurity can be prevented from diffusing into the first semiconductor wafer and stress distortion can be alleviated.

The second semiconductor wafer may also be provided with a silicon nitride film or a silicon nitride oxide film, which prevents diffusion of an impurity element, as a blocking layer (also referred to as a barrier layer). A silicon oxynitride film may be further combined as an insulating film which has an operation of alleviating stress.

Figure 3A:
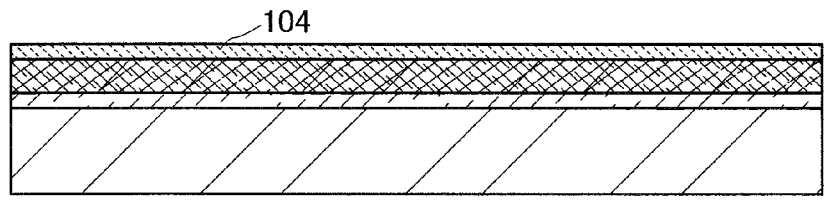
FIGS. 3A to 3C illustrate a manufacturing method of a semiconductor device according to the present invention.

Next, as illustrated in FIG. 3A, a silicon oxide film is formed as an insulating layer 104 on the surface which forms a bond with the second semiconductor wafer. A silicon oxide film which is formed by a chemical vapor deposition method with the use of an organosilane gas is preferable as the silicon oxide film. Alternatively, a silicon oxide film formed by a chemical vapor deposition method using a silane gas can be used. In the film formation by a chemical vapor deposition method, a film formation temperature of, for example, 350° C. or lower (300° C. as a specific example) is applied as the temperature that does not cause degasification from the embrittlement layer 110 which is formed in the single crystal semiconductor substrate. Further, heat treatment temperature which is higher than the film formation temperature is applied for the heat treatment when a semiconductor layer is separated from a single crystal semiconductor wafer or a polycrystalline semiconductor wafer.

The insulating layer 104 has a smooth surface and forms a hydrophilic surface. A silicon oxide film is suitable for the insulating layer 104. In particular, a silicon oxide film formed by a chemical vapor deposition method using an organosilane gas is preferable. Examples of the organosilane gas include silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Note that, in the case where a silicon oxide layer is formed by a chemical vapor deposition method using organosilane as a source gas, it is preferable to mix a gas which provides oxygen. Oxygen, nitrous oxide, nitrogen dioxide, or the like can be used as a gas which provides oxygen. Further, an inert gas such as argon, helium, nitrogen, or hydrogen may be mixed.

Further, as the insulating layer 104, a silicon oxide film formed by a chemical vapor deposition method using silane such as monosilane, disilane, trisilane, or the like as a source gas can also be used. Also in this case, it is preferable to mix an inert gas, a gas which provides oxygen, or the like. In addition, the silicon oxide film to serve as an insulating layer bonded to the single crystal semiconductor layer may contain chlorine. In film formation by a chemical vapor deposition method, a film formation temperature of, for example, 350° C. or lower is applied as the temperature that does not cause degasification from the embrittlement layer 110 which is formed in the first semiconductor wafer 108. Further, heat treatment temperature which is higher than the film formation temperature is applied when a semiconductor layer is separated from the single crystal or polycrystalline first semiconductor wafer. Note that a chemical vapor deposition (CVD) method in this specification includes a plasma CVD method, a thermal CVD method, and a photo CVD method in its category.

Further alternatively, as the insulating layer 104, silicon oxide formed by heat treatment under an oxidizing atmosphere, silicon oxide which grows by reaction of oxygen radicals, chemical oxide formed using an oxidative chemical solution, or the like can be used. As the insulating layer 104, an insulating layer including a siloxane (Si—O—Si) bond may be used. Alternatively, the organosilane gas may be reacted with an oxygen radical or a nitrogen radical to form the insulating layer 104.

The insulating layer 104 which has a smooth surface and forms a hydrophilic surface is provided at a thickness of 5 nm to 500 nm, preferably, 10 nm to 200 nm. If the thickness is set in this range, it is possible to smooth surface roughness of the insulating layer 104 and also to ensure smoothness of the growth surface of the film. In addition, distortion of the second semiconductor wafer and the semiconductor layer that are to be bonded to each other can be alleviated.

A silicon oxide film which is similar to the insulating layer 104 may also be provided for the second semiconductor wafer 101. That is, when a single crystal semiconductor layer 102 is bonded to the second semiconductor wafer 101, a strong bond can be formed by preferably providing the insulating layer 104 which is formed of a silicon oxide film using organosilane as a raw material for one surface or both surfaces which form a bond.

Figure 3B:
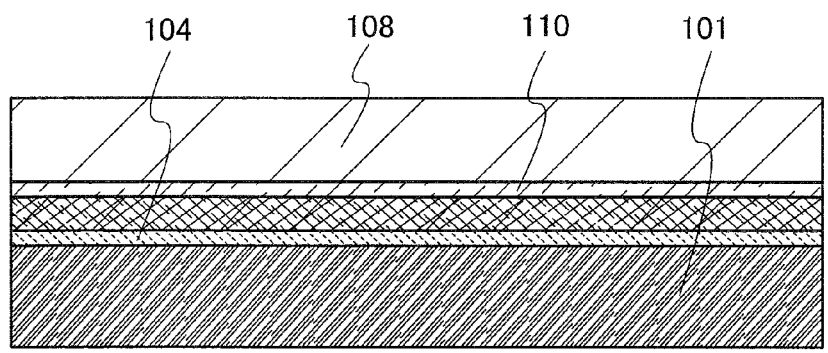

FIG. 3B illustrates a mode in which the second semiconductor wafer 101 and the surface of the insulating layer 104, which is formed over the first semiconductor wafer 108, are disposed to be in close contact with each other and are bonded. Surfaces which are to form a bond are cleaned sufficiently. The surfaces of the second semiconductor wafer 101 and the insulating layer 104 of the first semiconductor wafer 108 may be cleaned by megasonic cleaning or the like. In addition, the surfaces may be cleaned with ozone water after megasonic cleaning to remove an organic substance and improve the hydrophilicity of the surfaces.

By making the second semiconductor wafer 101 and the insulating layer 104 face each other and pressing one part thereof from the outside, the second semiconductor wafer 101 and the insulating layer 104 attract each other by increase in van der Waals forces or contribution of hydrogen bonding due to local reduction in distance between the bonding surfaces. Further, since the distance between the second semiconductor wafer 101 and the insulating layer 104 in an adjacent region, which also face each other, is reduced, a region which is strongly influenced by van der Waals forces or a region to which hydrogen bonding contributes is spread. Accordingly, bonding proceeds and spreads to the entire bonding surface. For example, a pressure of about 100 kPa to 5000 kPa may be applied. Further, the first semiconductor wafer and the second semiconductor wafer can be disposed so as to overlap with each other, so that bonding can spread under the weight of the overlapping substrate.

In order to form a favorable bond, the surface may be activated. For example, the surface that is to form a bond is irradiated with an atomic beam or an ion beam. In the case of utilizing the atomic beam or the ion beam, an inert gas neutral atomic beam or an inert gas ion beam of argon or the like can be used. Alternatively, plasma irradiation or radical treatment is performed. Such surface treatment facilitates formation of a bond between different kinds of materials even at a low temperature.

In order to improve bonding strength at a bond interface between the second semiconductor wafer and the insulating layer, heat treatment is preferably performed. For example, heat treatment is performed in a temperature condition of 70° C. to 350° C. (e.g., at 200° C. for 2 hours) in an oven, a furnace, or the like.

Figure 3C:
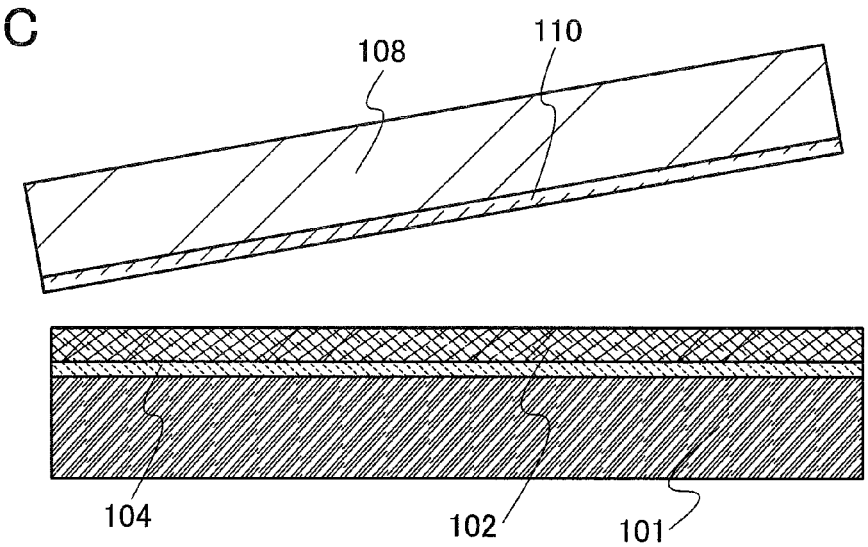

In FIG. 3C, after the second semiconductor wafer 101 and the first semiconductor wafer 108 are bonded to each other, heat treatment is performed, and the first semiconductor wafer 108 is separated from the second semiconductor wafer 101 using the embrittlement layer 110 as a cleavage plane. When heat treatment is performed at, for example, 400° C. to 700° C., the volume of microvoids formed in the embrittlement layer 110 changes. Therefore, cleavage can be caused along the embrittlement layer 110. Since the insulating layer 104 is bonded to the second semiconductor wafer 101, the single crystal semiconductor layer 102 having the same crystallinity as that of the first semiconductor wafer 108 remains over the second semiconductor wafer 101. The temperature of the heat treatment is preferably equal to or higher than the film formation temperature of the insulating layer having a bonding surface and equal to or lower than the allowable temperature limit of the semiconductor wafer.

By the heat treatment included in the process in which the single crystal semiconductor layer is separated from the first semiconductor wafer and transferred to the second semiconductor wafer by bonding, the impurity region to which the impurity element having one conductivity type is added can be activated as well. Therefore, it is not necessary to add a heating step for activation of the impurity element which is added in the channel doping step.

In this embodiment mode, since a silicon wafer having a high allowable temperature limit is used as the first semiconductor wafer 108 and the second semiconductor wafer 101, heat treatment at 1000° C. or higher (typically, 100° C. to 1300° C.) can be performed. In an ion irradiation step to form an embrittlement layer, a single crystal semiconductor layer of the first semiconductor wafer 108 is damaged by being irradiated with ions. In the above-described heat treatment to increase the bonding strength between the first semiconductor wafer 108 and the second semiconductor wafer 101, damage to the single crystal semiconductor layer due to the ion irradiation step is also recovered. Further, by performing high-temperature heat treatment on the single crystal semiconductor layer over the second semiconductor wafer 101, crystallinity and planarity of the surface can be improved.

With the use of a silicon oxide film formed by a plasma CVD method as the insulating layer, a bond between the first semiconductor wafer and the second semiconductor wafer can be formed at a temperature of less than or equal to 700° C. Heat treatment in a temperature range of 400° C. to 700° C. may be continuously performed with the same device as the above heat treatment for improving the bonding strength or may be performed with another device.

After the heat treatment, the second semiconductor wafer and the first semiconductor wafer are in a state where one of the second semiconductor wafer and the first semiconductor wafer is provided over the other, and the second semiconductor wafer and the first semiconductor wafer can be separated from each other without application of large force. For example, a substrate provided over the other is lifted by a vacuum chuck, so that the substrates can be easily separated. At this time, if a substrate on the lower side is fixed with a vacuum chuck or a mechanical chuck, the second semiconductor wafer and the first semiconductor wafer can be separated from each other without horizontal misalignment.

Note that FIGS. 3A to 3C and FIGS. 4A to 4D illustrate an example in which the first semiconductor wafer 108 and the second semiconductor wafer 101 have the same size; however, the present invention is not limited thereto, and the first semiconductor wafer 108 may be smaller than or larger than the second semiconductor wafer 101.

In the channel doping step, the impurity element may be directly added to the first semiconductor wafer, or a protective layer, an insulating layer used for bonding, or the like may be formed over the first semiconductor wafer and the impurity element may be added through the insulating layer.

Figure 4A:
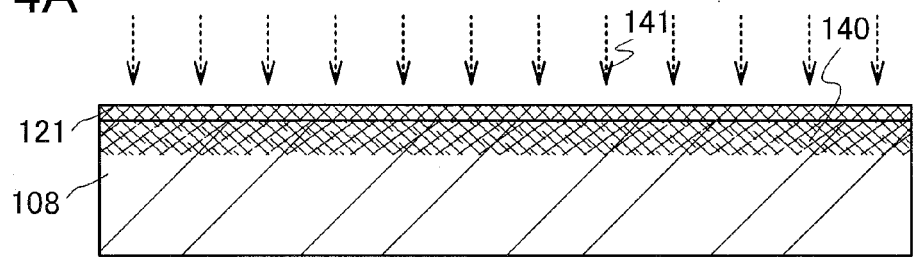
FIGS. 4A to 4D illustrate a manufacturing method of a semiconductor device according to the present invention.
Figure 4B:
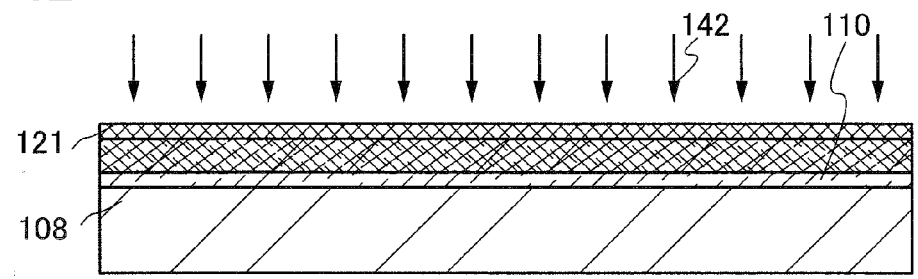

FIGS. 4A to 4D illustrate steps in which an insulating layer is formed on the second semiconductor wafer and is bonded to a single crystal semiconductor layer including an impurity element. FIG. 4A illustrates an example of forming the impurity region 140 by adding, as a channel doping step, the impurity element 141 imparting one conductivity type to the first semiconductor wafer 108 through a protective layer 121 which is formed of a silicon oxide film on the first semiconductor layer 108. In addition, a step of forming the embrittlement layer 110 by adding ions 142 accelerated by electric field to a predetermined depth of the first semiconductor wafer 108 including the impurity region 140 through the protective layer 121 is illustrated (see FIG. 4B). The irradiations with the impurity element 141 and the ions 142 are similar to those in the case of FIGS. 1B and 1C. If the protective layer 121 is formed on the surface of the first semiconductor wafer 108, the surface can be prevented from being damaged by the irradiation with the impurity element and the ions, and accordingly degradation of planarity can be prevented. In addition, the protective layer 121 has an advantageous effect of preventing the diffusion of impurities into the single crystal semiconductor layer 102 formed using the first semiconductor wafer 108.

Figure 4C:
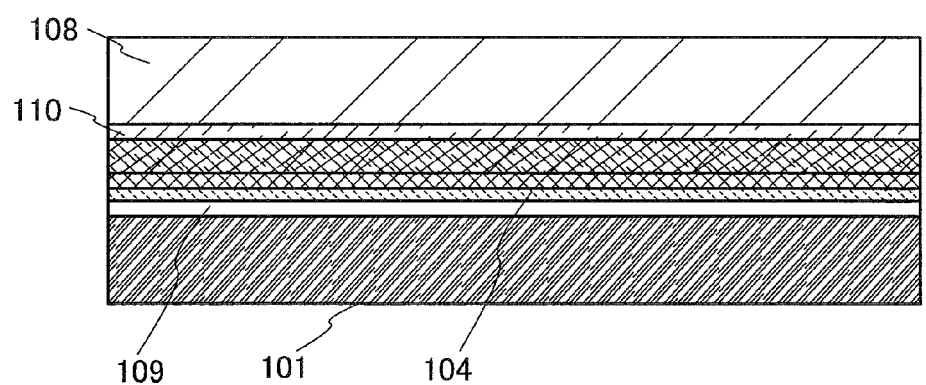

FIG. 4C illustrates a step in which the second semiconductor wafer 101 provided with a blocking layer 109 and the insulating layer 104, and the protective layer 121 of the first semiconductor wafer 108 are disposed to be in close contact with each other to form a bond. The bond is formed by disposing the insulating layer 104 over the second semiconductor wafer 101 to be in close contact with the protective layer 121 of the first semiconductor wafer 108.

Figure 4D:
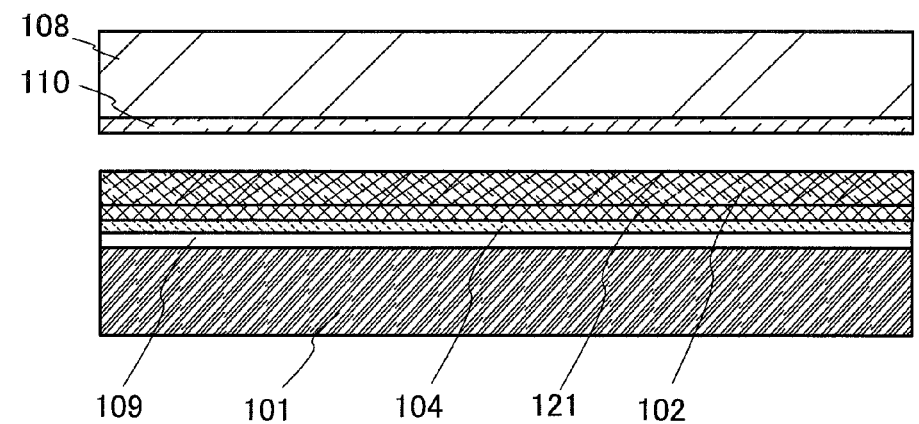

Then, the first semiconductor wafer 108 is separated as illustrated in FIG. 4D. Heat treatment by which a single crystal semiconductor layer is separated is performed in a similar manner to the case of FIG. 3C. In this manner, a second semiconductor wafer having an SOI structure illustrated in FIG. 4D can be obtained.

As the second semiconductor wafer 101, a semiconductor wafer such as a silicon wafer or a germanium wafer, or a compound semiconductor wafer such as a gallium arsenide wafer or an indium phosphide wafer is used. It is preferable that a single crystal semiconductor wafer be used as the second semiconductor wafer 101, but a polycrystalline semiconductor wafer may be used as well. Alternatively, a semiconductor wafer formed of silicon having lattice distortion, silicon germanium in which germanium is added to silicon, or the like may be used. Silicon having lattice distortion can be formed by formation of silicon on silicon germanium or silicon nitride which has a larger lattice constant than silicon.

Through the above-described process, as illustrated in FIG. 4D, the insulating layer 104 is provided over the second semiconductor wafer 101, and then the single crystal semiconductor layer 102, which is separated from the first semiconductor wafer 108, is formed over the insulating layer 104.

The single crystal semiconductor layer is separated from the first semiconductor wafer and transferred to the second semiconductor wafer so that the surface of the single crystal semiconductor layer through which the impurity element is added in the channel doping step faces the second semiconductor wafer side. Accordingly, the surface (the surface opposite to the surface through which the impurity element is added) of the single crystal semiconductor layer transferred to be placed over the second semiconductor wafer can be prevented from suffering damage (such as surface roughness and entry of contaminants) from the channel doping step.

The single crystal semiconductor layer which is separated from the first semiconductor wafer and transferred to the second semiconductor wafer may be irradiated with a laser beam so as to reduce crystal defects. At least part of the single crystal semiconductor layer can be melted by irradiation with a laser beam, whereby crystal defects in the single crystal semiconductor layer can be reduced. Note that an oxide film (a film which has been naturally oxidized or a chemical oxide film) formed on the surface of the single crystal semiconductor layer is preferably removed using a dilute hydrofluoric acid before irradiation with the laser beam.

Irradiation with a laser beam can be performed in an atmosphere containing oxygen such as an air atmosphere or in an inert atmosphere such as a nitrogen atmosphere.

Further, polishing treatment or etching treatment may be performed on the surface of the single crystal semiconductor layer. By the polishing treatment or the etching treatment, the single crystal semiconductor layer can be thinned; accordingly, planarity of the surface of the single crystal semiconductor layer can be improved. The polishing treatment or the etching treatment may be performed either before or after the laser beam irradiation step or may be performed both before and after the laser beam irradiation step.

For the polishing treatment, a chemical mechanical polishing (CMP) method or a liquid jet polishing method can be used. Note that the surface of the single crystal semiconductor layer is cleaned and purified before the polishing treatment. The cleaning may be performed by megasonic cleaning, two-fluid jet cleaning, or the like; and dust or the like on the surface of the single crystal semiconductor layer is removed by the cleaning. In addition, it is preferable to remove a natural oxide film or the like on the surface of the single crystal semiconductor layer by using a dilute hydrofluoric acid to expose the single crystal semiconductor layer.

The etching treatment may be performed by dry etching, wet etching, or both of them.

The single crystal semiconductor layer transferred from the first semiconductor wafer to the second semiconductor wafer may be subjected to etching treatment, polishing treatment, or the like as long as a region used as a channel formation region in the single crystal semiconductor layer of the transistor to be manufactured becomes a channel doping region.

In this embodiment mode, an SOI substrate which has a single crystal semiconductor layer including an impurity region formed through a channel doping step can be manufactured in the above-described manner.

When a transistor is manufactured using a single crystal semiconductor layer provided in an SOI substrate, the transistor can have a controlled threshold voltage. In addition, a gate insulating layer can be thinned, and the localized interface state density with the gate insulating layer can be reduced. If the single crystal semiconductor layer is formed to be thin, a transistor of complete depletion type can also be formed over the second semiconductor wafer, using a single crystal semiconductor layer.

In this embodiment mode, when a single crystal silicon substrate is used as the first semiconductor wafer 108, a single crystal silicon layer can be obtained as the single crystal semiconductor layer 102. Accordingly, a transistor with high performance and high reliability, which can operate at high speed with a low consumption voltage and have a low subthreshold value and a high field-effect mobility, can be manufactured over a second semiconductor wafer.

It is to be noted that in the present invention, a semiconductor device refers to a device which can function by utilizing semiconductor characteristics. By using the present invention, a device having a circuit including semiconductor elements (e.g., transistors, memory elements, and/or diodes) or a semiconductor device such as a chip including a processor circuit can be manufactured.

In this manner, electric characteristics of a transistor is controlled in accordance with the function required for a second semiconductor wafer by a channel doping step of a first semiconductor wafer; accordingly, a semiconductor device with high performance and low power consumption can be achieved. Further, such a semiconductor device can be manufactured with high yield and high productivity without complicating a manufacturing process.

Embodiment Mode 2

In Embodiment Mode 2, a manufacturing method of a CMOS (complementary metal oxide semiconductor) will be described as an example of a manufacturing method of a semiconductor device including a semiconductor element having high performance and high reliability with high yield, with reference to FIGS. 5A to 5E and FIGS. 6A to 6E. Note that repetitive descriptions for the same components as or components having similar functions to the components in Embodiment Mode 1 are omitted.

An example of forming impurity regions under different channel doping conditions in accordance with the conductivity types of transistors to be manufactured, in a step of channel-doping a first semiconductor wafer, will be described in this embodiment mode. The different channel doping conditions mean adding impurity elements imparting different kinds of conductivity type or adding an impurity element having the same conductivity type at different concentrations.

As illustrated in FIG. 5A, the first semiconductor wafer 108 is used. Next, a mask 146 which selectively covers the first semiconductor wafer 108 is formed. An impurity element 143 imparting one conductivity type is selectively added using the mask 146, so that an impurity region 145 is formed in the first semiconductor wafer 108 (see FIG. 5B). The impurity region 145 is a channel doping region.

The mask 146 is removed, and a mask 148 which selectively covers the first semiconductor wafer 108 is formed. An impurity element 144 imparting one conductivity type is selectively added using the mask 148, so that an impurity region 147 is formed in the first semiconductor wafer 108 (see FIG. 5C). The impurity region 147 is a channel doping region.

In this manner, performing the channel doping step selectively on the first semiconductor wafer makes it possible to form impurity regions under different channel doping conditions in the first semiconductor wafer 108.

In the channel doping step, an impurity element imparting n-type conductivity (typically, phosphorus (P), arsenic (As), or the like) or an impurity element imparting p-type conductivity (typically, boron (B), aluminum (Al), gallium (Ga), or the like) can be used as the impurity element which is added and imparts one conductivity type. One kind of impurity element or plural kinds of impurity elements having different conductivity types may be used. The adding step may be performed once or plural times. Further, impurity elements imparting different conductivity types may be selectively added in accordance with the conductivity types of transistors to be manufactured to form impurity regions having different conductivity types in the first semiconductor wafer.

For example, in the case where an influence of an interface charge is taken into consideration, the threshold voltage of an n-channel transistor, whose carriers are electrons, tends to be shifted toward the minus side, and the threshold voltage of a p-channel transistor, whose carriers are holes, tends to be shifted toward the plus side. In such a case, an impurity element imparting one conductivity type, which is added to a channel formation region for controlling the threshold voltage of the transistor, preferably has a conductivity type which is opposite to that of a source region or a drain region of the transistor. For example, in the n-channel transistor in which the threshold voltage is shifted toward the minus side, an impurity element imparting p-type conductivity can be used as the impurity element contained in the impurity region provided in the channel formation region. Further, in the p-channel transistor in which the threshold voltage is shifted toward the plus side, an impurity element imparting n-type conductivity can be used as the impurity element contained in the impurity region provided in the channel formation region.

The first semiconductor wafer 108 including the impurity region 145 and the impurity region 147 is irradiated with the ions 142; accordingly, the embrittlement layer 110 is formed (see FIG. 5D). The first semiconductor wafer 108 is attached to the second semiconductor wafer 101 provided with the insulating layer 104 so that the insulating layer 104 and the first semiconductor wafer 108 are bonded to each other, and heat treatment is performed to transfer a single crystal semiconductor layer 130 to the second semiconductor wafer 101 side (see FIG. 5E). Through the above-described steps, an SOI substrate which has the single crystal semiconductor layer 130 including the plurality of different impurity regions can be manufactured.

Figure 6A:
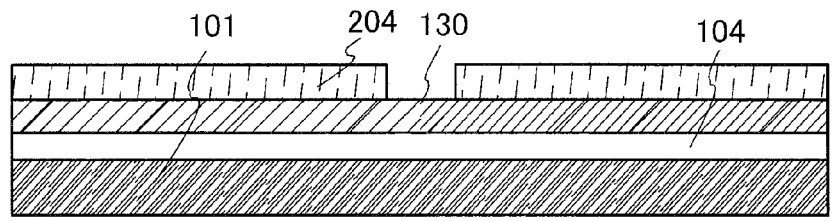
FIGS. 6A to 6E illustrate a manufacturing method of a semiconductor device according to the present invention.
Figure 6B:
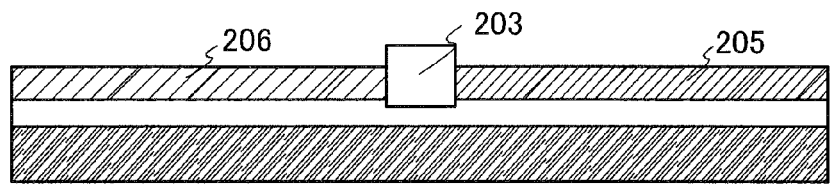
Figure 6C:
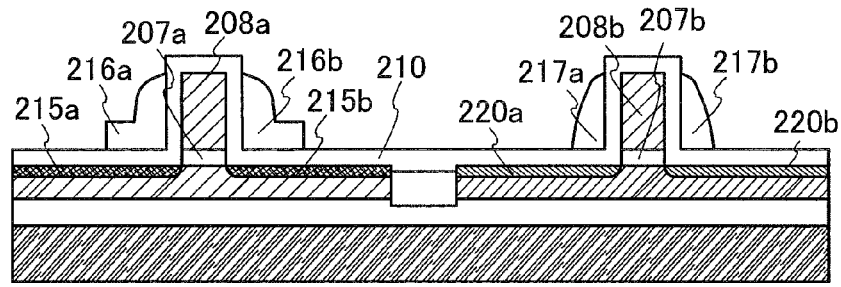
Figure 6D:
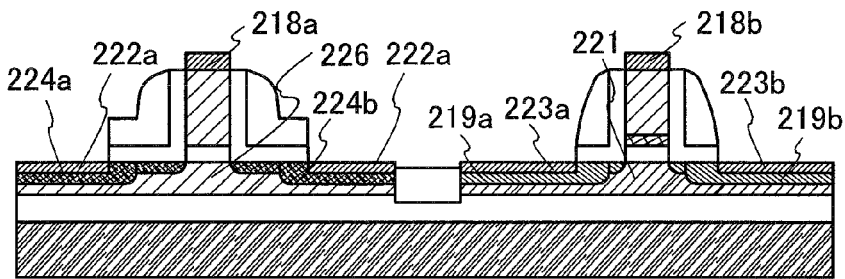

In FIG. 6A, the insulating layer 104 and the single crystal semiconductor layer 130 are formed over the second semiconductor wafer 101. The single crystal semiconductor layer 130 and the insulating layer 104 correspond to those in FIG. 5E. A protective layer 204 is selectively formed over the single crystal semiconductor layer 130. Note that here, although an example is described in which an SOI substrate having the structure illustrated in FIG. 6A is used, an SOI substrate having another structure described in this specification can also be used.

The single crystal semiconductor layer 130 includes impurity regions (channel doping regions) into which a p-type impurity element such as boron, aluminum, or gallium and an n-type impurity element such as phosphorus or arsenic are added in accordance with the formation regions of an n-channel field-effect transistor and a p-channel field-effect transistor.

Etching is performed by using the protective layer 204 as a mask to remove an exposed part of the single crystal semiconductor layer 130 and part of the insulating layer 104, which is below the exposed part. Next, a silicon oxide film is stacked by a chemical vapor deposition method using organosilane. This silicon oxide film is stacked to be thick so that the single crystal semiconductor layer 130 is buried. Then, after removing the silicon oxide film overlapping with the single crystal semiconductor layer 130 by polishing, the protective layer 204 is removed; thus, an element separation insulating layer 203 is left. The single crystal semiconductor layer 130 is separated into an element region 205 and an element region 206 by the element separation insulating layer 203 (see FIG. 6B).

The element region 205 is formed from the impurity region 145, and the element region 206 is formed from the impurity region 147. Each of the impurity regions 145 and 147 is a region containing an impurity element imparting one conductivity type formed under a channel doping condition corresponding to the electric characteristics required for the transistor to be manufactured.

Next, a first insulating film is formed, and gate electrode layers 208a and 208b which include a polysilicon film containing a conductive material are formed over the first insulating film. Then, the first insulating film is etched using the gate electrode layers 208a and 208b as masks; accordingly, gate insulating layers 207a and 207b are formed.

The gate insulating layers 207a and 207b may be formed of a silicon oxide film or a stacked structure of a silicon oxide film and a silicon nitride film. Alternatively, a silicon oxynitride film, a silicon nitride oxide film, or the like can be used for the gate insulating layers 207a and 207b. The gate insulating layers 207a and 207b may be formed by depositing an insulating film by a plasma CVD method or a low pressure CVD method or may be formed by solid phase oxidation or solid phase nitridation by plasma treatment. This is because a gate insulating layer which is formed by oxidizing or nitriding a semiconductor layer by plasma treatment is dense, has high withstand voltage, and is excellent in reliability. For example, a surface of the single crystal semiconductor layer 130 (the element regions 205 and 206) is oxidized or nitrided using nitrous oxide ($N_2O$) diluted with Ar by 1 to 3 times (flow ratio) by application of a microwave (2.45 GHz) power of 3 to 5 kW at a pressure of 10 to 30 Pa. By this treatment, an insulating film with a thickness of 1 nm to 10 nm (preferably, 2 nm to 6 nm) is formed. Further, nitrous oxide ($N_2O$) and silane ($SiH_4$) are introduced, and a silicon oxynitride film is formed by a vapor deposition method by application of a microwave (2.45 GHz) power of 3 to 5 kW at a pressure of 10 to 30 Pa; accordingly, the gate insulating layer is formed. The combination of the solid phase reaction and the reaction by the vapor deposition method can form a gate insulating layer with a low interface state density and an excellent withstand voltage.

For the gate insulating layers 207a and 207b, a high dielectric constant material such as zirconium dioxide, hafnium oxide, titanium dioxide, tantalum pentoxide, or the like may be used. If a high dielectric constant material is used for the gate insulating layer 207, gate leakage current can be reduced.

The gate electrode layers 208a and 208b can be formed by a sputtering method, an evaporation method, a CVD method, or the like. The gate electrode layers 208a and 208b may be formed of an element selected from tantalum (Ta), tungsten (W), titanium (Ti), molybdenum (Mo), aluminum (Al), copper (Cu), chromium (Cr), or neodymium (Nd); or an alloy material or a compound material that contains any of these elements as its main component. Alternatively, the gate electrode layers 208a and 208b may be formed using a semiconductor film typified by a polycrystalline silicon film doped with an impurity element such as phosphorus, or an AgPdCu alloy.

Next, a second insulating film 210 covering the gate electrode layers 208a and 208b is formed, and further sidewall insulating layers 216a, 216b, 217a, and 217b are formed on side surfaces of the gate electrode layers 208a and 208b. The sidewall insulating layers 216a and 216b in a region to be a p-channel field-effect transistor (pFET) are wider than the sidewall insulating layers 217a and 217b in a region to be an n-channel field-effect transistor (nFET). Then, arsenic (As) or the like is added into the region to be the n-channel field-effect transistor, so that first impurity regions 220a and 220b are formed at a shallow junction depth. Boron (B) or the like is added into the region to be the p-channel field-effect transistor, so that second impurity regions 215a and 215b are formed at a shallow junction depth (see FIG. 6C).

Next, the second insulating film 210 is partially etched to expose top surfaces of the gate electrode layers 208a and 208b, the first impurity regions 220a and 220b, and the second impurity regions 215a and 215b. Then, the region to be the n-channel field-effect transistor is doped with As or the like to form third impurity regions 219a and 219b at a deep junction depth, and the region to be the p-channel field-effect transistor is doped with B or the like to form fourth impurity regions 224a and 224b at a deep junction depth. Next, heat treatment (800° C. to 1100° C.) for activation is performed. Then, a cobalt film is formed as a metal film for forming a silicide over at least the third impurity regions 219a and 219b and the fourth impurity regions 224a and 224b. Further, heat treatment (500° C., 1 minute) such as RTA is performed to make silicon in a portion in contact with the cobalt film into silicide; accordingly, silicides 222a, 222b, 223a, and 223b are formed. After that, the cobalt film is selectively removed. Then, heat treatment is performed at a temperature higher than that of the heat treatment for silicidation in order to reduce resistance in the silicide portion (see FIG. 6D). A channel formation region 226 is formed in the element region 206, and a channel formation region 221 is formed in the element region 205.

Next, an interlayer insulating layer 227 is formed, and contact holes (openings) which reach the third impurity regions 219a and 219b formed at a deep junction depth and the fourth impurity regions 224a and 224b formed at a deep junction depth are formed in the interlayer insulating layer 227, using a resist mask. Etching may be performed once or a plurality of times depending on a selection ratio of a material to be used.

The etching method and conditions may be set as appropriate depending on the material of the interlayer insulating layer 227 in which the contact holes are formed. Wet etching, dry etching, or both of them may be used as appropriate. In this embodiment mode, dry etching is used. As an etching gas, a chlorine-based gas typified by $Cl_2$, $BC_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas to be used. As an inert element to be added, one or more of elements selected from He, Ne, Ar, Kr, or Xe can be used. As an etchant of wet etching, a hydrofluoric acid-based solution such as a mixed solution of ammonium hydrogen fluoride and ammonium fluoride may be used.

A conductive layer is formed so as to cover the contact holes, and the conductive layer is etched to form the wiring layers 242a, 242b, and 242c each functioning as a source electrode or a drain electrode that is electrically connected to a portion of the source region or the drain region. The wiring layers can be formed by forming a conductive film by a PVD method, a CVD method, an evaporation method, or the like and then etching the conductive film into a desired shape. Alternatively, a conductive layer can be selectively formed in a predetermined position by a droplet discharge method, a printing method, an electroplating method, or the like. Further alternatively, a reflow method or a damascene method may be employed. As a material for the wiring layers, metal such as Ag, Au, Cu, Ni, Pt, Pd, Ir, Rh, W, Al, Ta, Mo, Cd, Zn, Fe, Ti, Zr, Ba, or the like; Si or Ge; or an alloy or nitride thereof can be used. A stacked structure of these materials may also be used.

In this embodiment mode, wiring layers 240a, 240b, 240c, and 240d are formed as embedded wiring layers to fill the contact holes formed in the interlayer insulating layer 227. The embedded wiring layers 240a, 240b, 240c, and 240d are formed by forming a conductive film having an enough thickness to fill the contact holes and polishing the conductive film by a CMP method or the like so that the conductive film can remain only in contact hole portions and unnecessary parts of the conductive film are removed.

An insulating layer 228 and wiring layers 241a, 241b, and 241c as lead wiring layers are formed over the embedded wiring layers 240a, 240b, 240c, and 240d, whereby the wiring layers 242a, 242b, and 242c are formed.

Figure 6E:
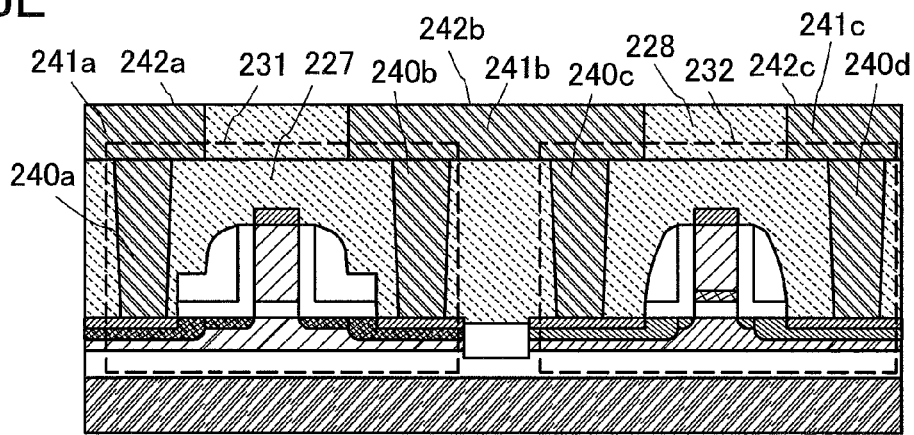

Through the above-described process, an n-channel field-effect transistor 232 and a p-channel field-effect transistor 231 can be manufactured using the element region 206 and the element region 205, respectively, of the single crystal semiconductor layer 130 bonded to the second semiconductor wafer 101 (see FIG. 6E). The channel formation region 226 is formed using the impurity region 147 to which the impurity element 144 imparting one conductivity type is added, and the channel formation region 221 is formed using the impurity region 145 to which the impurity element 143 imparting one conductivity type is added. Accordingly, the p-channel field-effect transistor 231 and the n-channel field-effect transistor 232 can have required appropriate electric characteristics such as the threshold voltage controlled by the channel doping step. Note that in this embodiment mode, the n-channel field-effect transistor 232 and the p-channel field-effect transistor 231 are electrically connected to each other with the wiring layer 242b.

The n-channel field-effect transistor 232 and the p-channel field-effect transistor 231 are complementarily combined in the above-described manner, so that a CMOS structure can be formed.

Wirings or elements are additionally stacked over the CMOS structure, so that a semiconductor device such as a microprocessor can be manufactured. Note that the microprocessor includes an arithmetic logic unit (also referred to as an ALU), an ALU controller, an instruction decoder, an interrupt controller, a timing controller, a register, a register controller, a bus interface (Bus I/F), a read only memory (ROM), and a memory interface (ROM I/F).

In the microprocessor, an integrated circuit having a CMOS structure is formed; therefore, processing speed is increased and besides, power consumption can be reduced.

The thin film transistor is not limited to this embodiment mode, and may have a single gate structure in which one channel formation region is formed, a double gate structure in which two channel formation regions are formed, or a triple gate structure in which three channel formation regions are formed.

In this manner, electric characteristics of a transistor is controlled in accordance with the function required for a second semiconductor wafer by a channel doping step of a first semiconductor wafer; accordingly, a semiconductor device with high performance and low power consumption can be achieved. Further, such a semiconductor device can be manufactured with high yield and high productivity without complicating a manufacturing process.

Embodiment Mode 3

In Embodiment Mode 3, an example of a semiconductor device having high performance and high reliability will be described. Specifically, as examples of the semiconductor device, examples of a microprocessor and a semiconductor device which has an arithmetic function and can transmit and receive data without contact will be described.

Figure 7:
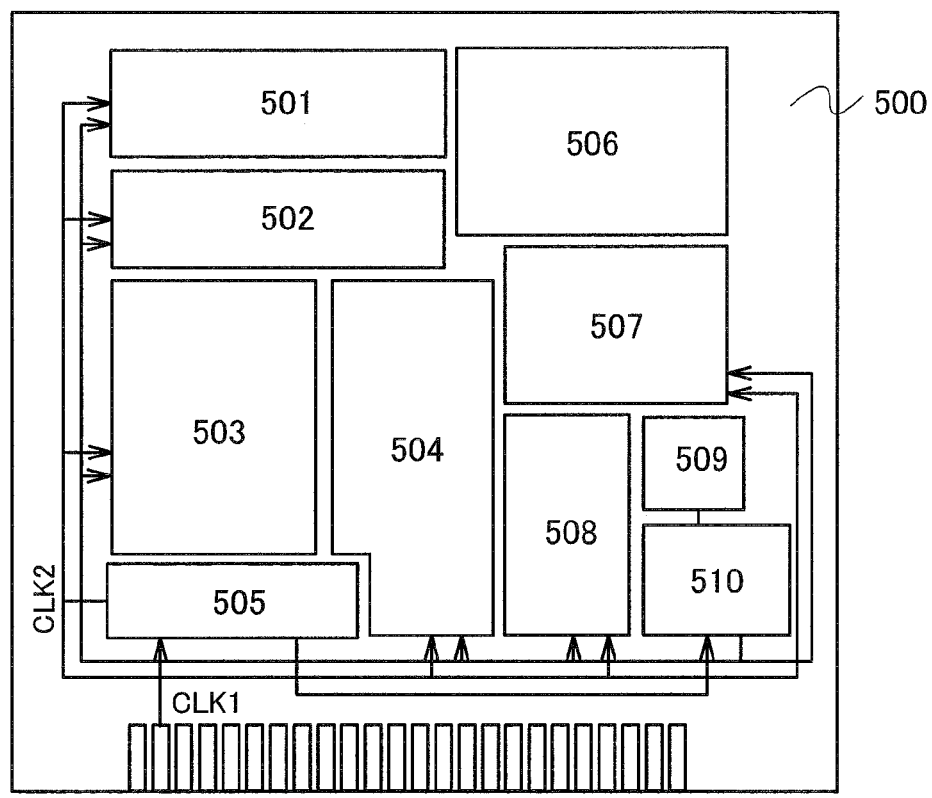
FIG. 7 is a block diagram illustrating a structure of a microprocessor which is an example of a semiconductor device according to the present invention.

FIG. 7 illustrates an example of a microprocessor 500 as an example of a semiconductor device. The microprocessor 500 is manufactured using a semiconductor wafer having the SOI structure according to the present invention. This microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded therein. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state and processes the request while a program is executed in the microprocessor 500. The register controller 507 generates an address of the register 506, and reads/writes data from/to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to each of the above-mentioned circuits. Note that the microprocessor 500 illustrated in FIG. 7 is just an example of the simplified structure, and practical microprocessors can have various structures depending on usage.

In the microprocessor 500, an integrated circuit is formed using a single crystal semiconductor layer with a uniform crystal orientation which is bonded to a semiconductor wafer; therefore, processing speed is increased and besides, power consumption can be reduced.

Figure 8:
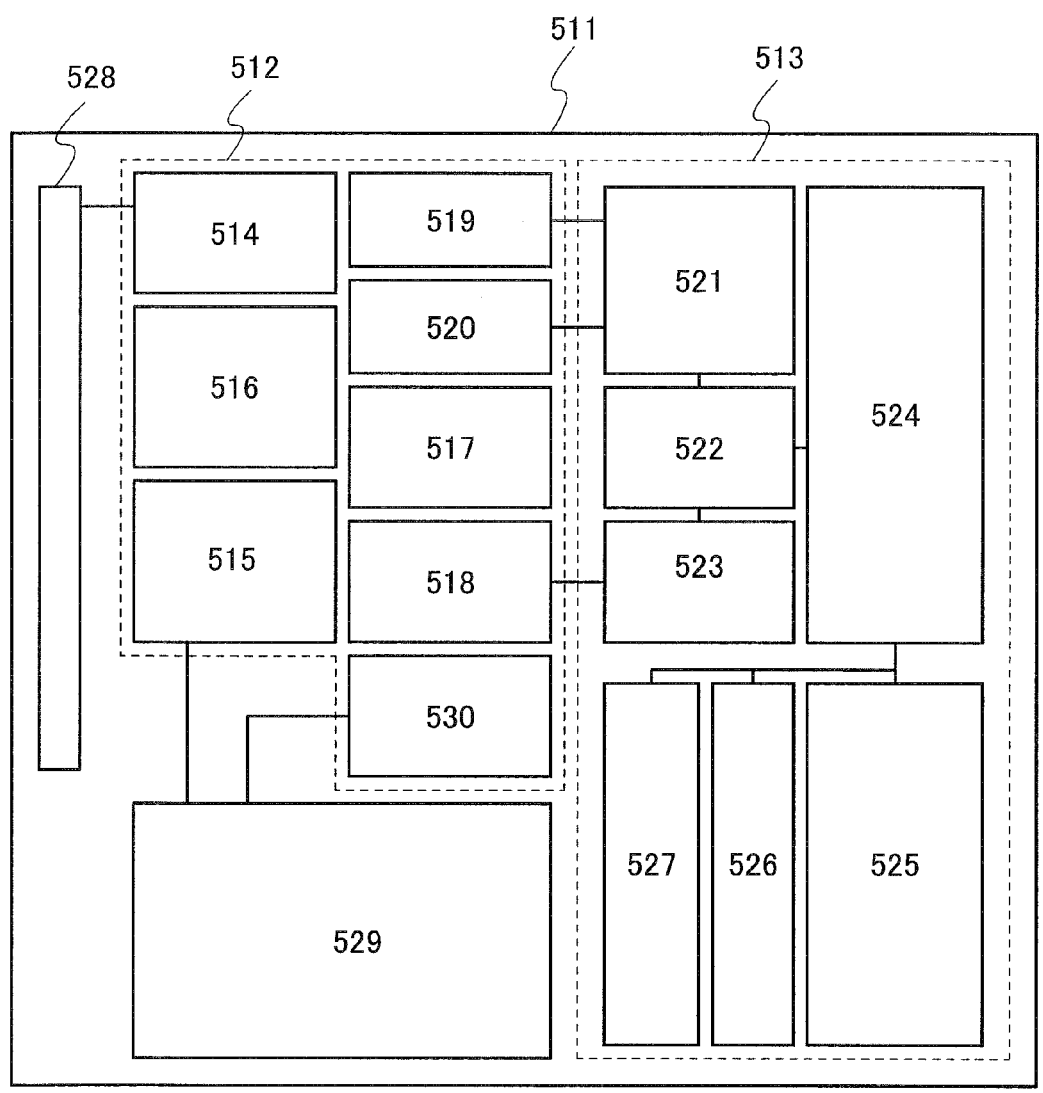
FIG. 8 is a block diagram illustrating a structure of an RFCPU which is an example of a semiconductor device according to the present invention.

Next, an example of a semiconductor device which has an arithmetic function and can transmit and receive data without contact will be described with reference to FIG. 8. FIG. 8 illustrates an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly as follows. The resonance circuit 514 generates induced electromotive force based on a signal received by an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate that partially constitutes the RFCPU 511.

The reset circuit 517 generates a signal that resets the digital circuit portion 513 to be initialized. For example, the reset circuit generates a signal which rises after rise in the power supply voltage with delay as a reset signal. The oscillator circuit 518 changes the frequency and the duty ratio of a clock signal depending on a control signal generated by the constant voltage circuit 516. The demodulation circuit 519 having a low pass filter binarizes changes in amplitude of reception signals of an amplitude shift keying (ASK) system, for example. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by a power supply control circuit 530.

A signal that is input to the RFCPU 511 from the antenna 528 is demodulated by the demodulation circuit 519, and then separated into a control command, data, and the like by the RF interface 521. The control command is stored in the control register 522. In the control command, instructions for reading data that is stored in the read only memory 527, writing data in the random access memory 526, performing an arithmetic calculation in the central processing unit 525, and the like are included. The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and then executed. Alternatively, a method may be employed in which a circuit dedicated to arithmetic is formed as an arithmetic circuit and an arithmetic processing is conducted using hardware. In a method in which both hardware and software are used, a method can be employed in which part of process is conducted in the circuit dedicated to arithmetic and the other part of the arithmetic process is conducted by the central processing unit 525 using a program.

In the RFCPU 511, an integrated circuit is formed using a single crystal semiconductor layer with a uniform crystal orientation which is bonded to a semiconductor wafer; therefore, processing speed is increased and besides, power consumption can be reduced. Accordingly, even when the capacitor portion 529 which supplies electric power is miniaturized, long-term operation can be secured.

This application is based on Japanese Patent Application serial no. 2007-264424 filed with Japan Patent Office on Oct. 10, 2007, the entire contents of which are hereby incorporated by reference.

What is claimed is:

1. A manufacturing method of a semiconductor device, comprising the steps of:
    adding a first impurity element imparting first conductivity type to a second region of the first semiconductor wafer, to form a first impurity region of a first transistor in the second region of the first semiconductor wafer;
    irradiating the first semiconductor wafer with ions to form an embrittlement layer in the first semiconductor wafer after adding the first impurity element;
    forming a first insulating layer over at least one of the first semiconductor wafer and a second semiconductor wafer;
    attaching the first semiconductor wafer to the second semiconductor wafer with the first insulating layer interposed therebetween;
    performing a second heat treatment to separate the first semiconductor wafer from the second semiconductor wafer along the embrittlement layer so that a semiconductor layer including the first impurity region is formed over the second semiconductor wafer;
    forming a second insulating layer over the semiconductor layer;
    forming a gate electrode over the second insulating layer;
    forming a third insulating layer over the gate electrode;
    forming a sidewall over the third insulating layer;
    adding a third impurity element so that a third impurity region is formed in the first impurity region;
    etching a part of the third insulating layer so that a part of an upper surface of the semiconductor layer is exposed;
    adding a fourth impurity element so that a fourth impurity region is formed under the third impurity region in the first impurity region;
    forming a metal layer containing cobalt over the semiconductor layer; and forming a silicide by heating the metal layer and the semiconductor layer.

2. The manufacturing method for a semiconductor device according to claim 1, wherein the semiconductor layer is a single crystal semiconductor layer.

3. The manufacturing method of a semiconductor device according to claim 1, wherein the first insulating layer has hydrophilic property.

4. The manufacturing method of a semiconductor device according to claim 1, wherein the first impurity element imparting first conductivity type has one kind of impurity element or plural kinds of impurity elements.

5. The manufacturing method of a semiconductor device according to claim 1, further comprising the steps of:
   forming a first mask over a first region of the first semiconductor wafer before adding the first impurity element;
   removing the first mask after adding the first impurity element;
   forming a second mask over the second region of the first semiconductor wafer;
   adding a second impurity element imparting second conductivity type to the first region of the first semiconductor wafer using the second mask, to form a second impurity region of a second transistor in the first region of the first semiconductor wafer;
   removing the second mask;
   performing a first heat treatment before the second heat treatment;
   forming a first protective layer over a part of an exposed surface of the first region;
   forming a second protective layer over a part of an exposed surface of the second region;
   etching an exposed portion of the semiconductor layer and a part of the first insulating layer using the first protective layer and the second protective layer as masks;
   forming a silicon oxide layer over the second semiconductor layer, the first protective layer and the second protective layer by a chemical vapor deposition using organosilane;
   removing a part of the silicon oxide layer by polishing;
   removing the first protective layer and the second protective layer, thereby an element separation insulating layer is left on the first insulating layer; and
   etching a part of the element separation insulating layer including an entire top surface of the element separation insulating layer so that a height of any part of a top surface of the element separation insulating layer is lower than a height of a top surface of the semiconductor layer before forming the second insulating layer.

6. The manufacturing method of a semiconductor device according to claim 5, further comprising the steps of:
   forming the first transistor using the first impurity region of the semiconductor layer as a channel formation region; and
   forming the second transistor using the second impurity region of the semiconductor layer as a channel formation region.

7. The manufacturing method of a semiconductor device according to claim 6, wherein the first transistor is a field-effect transistor.

8. The manufacturing method of a semiconductor device according to claim 5, wherein the first impurity region and the second impurity region are formed between an irradiated surface of the first semiconductor wafer and the embrittlement layer.

9. The manufacturing method of a semiconductor device according to claim 8, wherein a concentration peak of the first impurity element is located between the irradiated surface of the first semiconductor wafer and the embrittlement layer.

10. The manufacturing method of a semiconductor device according to claim 5, wherein a bottom surface of the element separation insulating layer is in direct contact with the first insulating layer.

11. A manufacturing method of a semiconductor device, comprising the steps of:
   adding a first impurity element imparting first conductivity type to a second region of the first semiconductor wafer, to form a first impurity region of a first transistor in the second region of the first semiconductor wafer;
   irradiating the first semiconductor wafer with ions to form an embrittlement layer in the first semiconductor wafer after adding the first impurity element;
   forming a first insulating layer over at least one of the first semiconductor wafer and a second semiconductor wafer;
   attaching the first semiconductor wafer to the second semiconductor wafer with the first insulating layer interposed therebetween;
   performing a second heat treatment to separate the first semiconductor wafer from the second semiconductor wafer along the embrittlement layer so that a semiconductor layer including the first impurity region is formed over the second semiconductor wafer;
   performing a third heat treatment at 1000° C. or higher after the second heat treatment;
   forming a second insulating layer over the semiconductor layer;
   forming a gate electrode over the second insulating layer;
   forming a third insulating layer over the gate electrode;
   forming a sidewall over the third insulating layer;
   adding a third impurity element so that a third impurity region is formed in the first impurity region;
   etching a part of the third insulating layer so that a part of an upper surface of the semiconductor layer is exposed;
   adding a fourth impurity element so that a fourth impurity region is formed under the third impurity region in the first impurity region;
   forming a metal layer containing cobalt over the semiconductor layer; and
   forming a silicide by heating the metal layer and the semiconductor layer.

12. The manufacturing method for a semiconductor device according to claim 11, wherein the semiconductor layer is a single crystal semiconductor layer.

13. The manufacturing method of a semiconductor device according to claim 11, wherein the first insulating layer has hydrophilic property.

14. The manufacturing method of a semiconductor device according to claim 11, wherein the first impurity element imparting first conductivity type has one kind of impurity element or plural kinds of impurity elements.

15. The manufacturing method of a semiconductor device according to claim 11, further comprising the steps of:
   forming a first mask over a first region of the first semiconductor wafer before adding the first impurity element;
   removing the first mask after adding the first impurity element;
   forming a second mask over the second region of the first semiconductor wafer;
   adding a second impurity element imparting second conductivity type to the first region of the first semiconductor wafer using the second mask, to form a second impurity region of a second transistor in the first region of the first semiconductor wafer;

removing the second mask;

performing a first heat treatment before the second heat treatment;

forming a first protective layer over a part of an exposed surface of the first region;

forming a second protective layer over a part of an exposed surface of the second region;

etching an exposed portion of the semiconductor layer and a part of the first insulating layer using the first protective layer and the second protective layer as masks;

forming a silicon oxide layer over the second semiconductor layer, the first protective layer and the second protective layer by a chemical vapor deposition using organosilane;

removing a part of the silicon oxide layer by polishing;

removing the first protective layer and the second protective layer, thereby an element separation insulating layer is left on the first insulating layer; and etching a part of the element separation insulating layer including an entire top surface of the element separation insulating layer so that a height of any part of a top surface of the element separation insulating layer is lower than a height of a top surface of the semiconductor layer before forming the second insulating layer.

16. The manufacturing method of a semiconductor device according to claim 15, further comprising the steps of:

forming the first transistor using the first impurity region of the semiconductor layer as a channel formation region; and forming the second transistor using the second impurity region of the semiconductor layer as a channel formation region.

17. The manufacturing method of a semiconductor device according to claim 16, wherein the first transistor is a field-effect transistor.

18. The manufacturing method of a semiconductor device according to claim 15, wherein the first impurity region and the second impurity region are formed between an irradiated surface of the first semiconductor wafer and the embrittlement layer.

19. The manufacturing method of a semiconductor device according to claim 18, wherein a concentration peak of the first impurity element is located between the irradiated surface of the first semiconductor wafer and the embrittlement layer.

20. The manufacturing method of a semiconductor device according to claim 15, wherein a bottom surface of the element separation insulating layer is in direct contact with the first insulating layer.

* * * * *